(12) United States Patent
Chen

(10) Patent No.: US 11,882,693 B2
(45) Date of Patent: Jan. 23, 2024

(54) METHOD FOR MANUFACTURING SEMICONDUCTOR DEVICE

(71) Applicant: CHANGXIN MEMORY TECHNOLOGIES, INC., Hefei (CN)

(72) Inventor: Tao Chen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 413 days.

(21) Appl. No.: 17/401,551

(22) Filed: Aug. 13, 2021

(65) Prior Publication Data

US 2022/0077160 A1    Mar. 10, 2022

Related U.S. Application Data

(63) Continuation of application No. PCT/CN2021/100706, filed on Jun. 17, 2021.

(30) Foreign Application Priority Data

Sep. 7, 2020   (CN) .......................... 202010927242.0

(51) Int. Cl.
| | | |
|---|---|---|
| H01L 21/00 | (2006.01) | |
| H01L 27/00 | (2006.01) | |
| H01L 29/00 | (2006.01) | |
| H10B 12/00 | (2023.01) | |
| H01L 21/762 | (2006.01) | |

(52) U.S. Cl.
CPC ..... *H10B 12/488* (2023.02); *H01L 21/76224* (2013.01)

(58) Field of Classification Search
CPC .... H10B 12/488; H10B 12/00; H10B 12/053; H10B 12/34; H10B 12/0335; H10B 12/30; H10B 12/315; H10B 12/482; H01L 21/76224; H01L 21/762; H01L 21/26533; H01L 21/265; H01L 21/768; H01L 21/02225; H01L 21/743

See application file for complete search history.

(56) References Cited

U.S. PATENT DOCUMENTS

| | | |
|---|---|---|
| 7,781,302 B2 | 8/2010 | Cha |
| 8,309,448 B2 | 11/2012 | Hwang |
| 8,829,583 B2 | 9/2014 | Taketani |
| 8,987,799 B2 | 3/2015 | Taketani |

(Continued)

FOREIGN PATENT DOCUMENTS

| | | |
|---|---|---|
| CN | 1255752 A | 6/2000 |
| CN | 110896075 A | 3/2020 |

(Continued)

*Primary Examiner* — Nikolay K Yushin
(74) *Attorney, Agent, or Firm* — Cooper Legal Group, LLC

(57) ABSTRACT

The disclosure provides a method for manufacturing a semiconductor device. The method includes the following operations. A substrate on which an active region and a shallow trench isolation structure are formed, is provided. A first isolation layer is formed in the active region by an ion-doping technique. The active region surrounded by the first isolation layer is ion-implanted to form a first wordline structure. A second wordline structure is formed in the shallow trench isolation structure, and the first wordline structure and the second wordline structure are connected to form a buried wordline structure extending along a surface of the substrate.

11 Claims, 10 Drawing Sheets

(56) References Cited

U.S. PATENT DOCUMENTS

| | | |
|---|---|---|
| 9,305,926 B2 | 4/2016 | Taketani |
| 2007/0269957 A1 | 11/2007 | Cha |
| 2011/0027988 A1 | 2/2011 | Hwang |
| 2012/0211813 A1 | 8/2012 | Taketani |
| 2014/0346595 A1 | 11/2014 | Taketani |
| 2015/0171089 A1 | 6/2015 | Taketani |
| 2020/0381439 A1* | 12/2020 | Ikeda .................. H10B 12/482 |

FOREIGN PATENT DOCUMENTS

| | | |
|---|---|---|
| CN | 110931486 A | 3/2020 |
| CN | 110970346 A | 4/2020 |
| EP | 1003219 A2 | 5/2000 |
| EP | 1003219 A3 | 6/2001 |
| EP | 1003219 B1 | 12/2011 |

* cited by examiner

METHOD FOR MANUFACTURING SEMICONDUCTOR DEVICE

CROSS-REFERENCE TO RELATED APPLICATIONS

This is a continuation application of International Patent Application No. PCT/CN2021/100706, filed on Jun. 17, 2021, which claims priority to Chinese Patent Application No. 202010927242.0, filed on Sep. 7, 2020 and entitled "METHOD FOR MANUFACTURING SEMICONDUCTOR DEVICE". The entire contents of International Patent Application No. PCT/CN2021/100706 and Chinese Patent Application No. 202010927242.0 are incorporated herein by reference in their entireties.

TECHNICAL FIELD

The disclosure relates to the technical field of semiconductors, and in particular to a method for manufacturing a semiconductor device.

BACKGROUND

A Dynamic Random Access Memory (DRAM) is a common system memory in which each cell includes a transistor and a capacitor corresponding thereto. The amount of charge stored in the capacitor represents 0 and 1. In order to avoid data errors caused by insufficient charge, the capacitor needs to be refreshed periodically. In order to improve the integration of DRAM to speed up the operational speed of each cell and to cope with the strong demand for DRAM from the markets of personal computers (PCs), smartphones, tablet PCs or the like, DRAM having a buried wordline structure, i.e., a buried wordline DRAM, has been developed in recent years to meet the above-mentioned demand.

In the DRAM having the buried wordline structure, a buried wordline is formed in a substrate and penetrates an active region of the substrate, so that a part of the wordline may be multiplexed as a gate of a transistor of a cell, and source and drain regions of the transistor are formed in the substrate on both sides of the part of the wordline. The conventional method for manufacturing the buried wordline has problems such as cumbersome manufacture steps, and an uneven thickness of an isolation layer of the wordline formed in the manufacture process may easily cause leakage and lead to poor yield rate of the semiconductor device.

It should be noted that the information disclosed in the foregoing background section is merely intended to enhance understanding of the background of the disclosure, and thus may include information that does not constitute the related art known to those of ordinary skill in the art.

SUMMARY

An object of the disclosure is to provide a method for manufacturing a semiconductor device.

According to an aspect of the disclosure, there is provided a method for manufacturing a semiconductor device, including the following operations: A substrate on which a shallow trench isolation structure and an active region are formed, is provided, the shallow trench isolation structure is filled with an insulating material; A first isolation layer is formed in the active region by an ion-doping technique, the first isolation layer surrounds a part of the active region; The active region surrounded by the first isolation layer is ion-implanted to form a first wordline structure; A second wordline structure is formed in the shallow trench isolation structure, and the first wordline structure and the second wordline structure are connected to form a buried wordline structure extending along a surface of the substrate.

It should be understood that the foregoing general description and the following detailed description are exemplary and explanatory only, and are not intended to limit the disclosure.

BRIEF DESCRIPTION OF THE DRAWINGS

Here the drawings are incorporated in the description and constitute a part of the description, illustrate embodiments conforming with the disclosure, and together with the description, serve to explain the principles of the disclosure. Obviously, the drawings in the following description are merely some embodiments of the disclosure, and other drawings may also be obtained by those of ordinary skill in the art from these drawings without paying any creative work.

DETAILED DESCRIPTION

Figure 1:
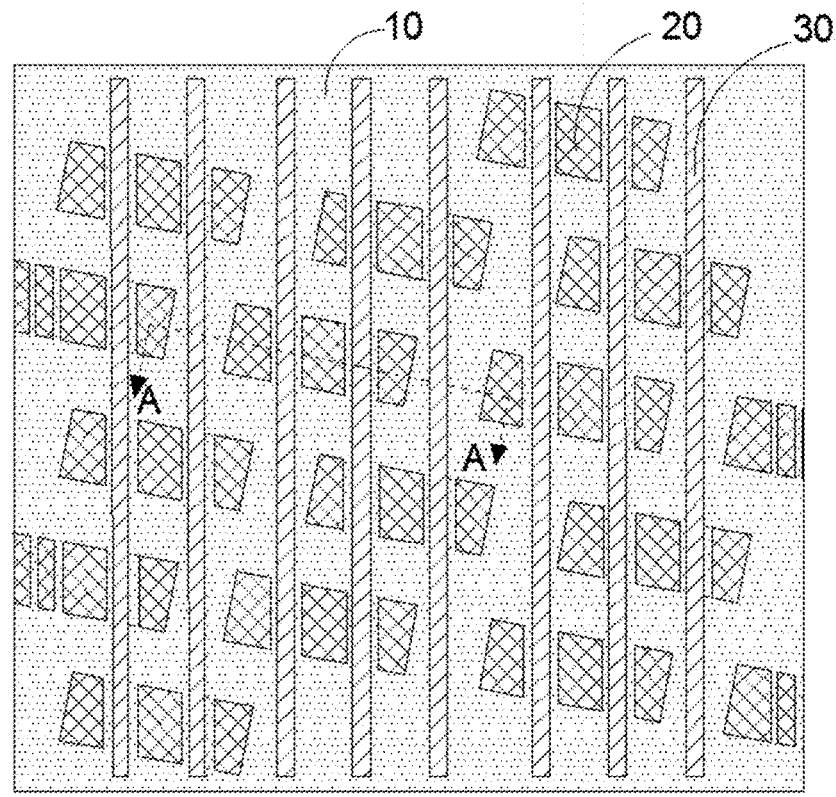
FIG. 1 is a top view of a semiconductor device.

Now example embodiments will be described more fully with reference to the drawings. However, the example embodiments may be implemented in various forms and should not be construed as being limited to the embodiments set forth herein; instead, these embodiments are provided so that the disclosure will be more thorough and complete, and the concepts of the exemplary embodiments will be conveyed fully to those skilled in the art. Like reference numerals in the drawings denote like or similar structures, and thus detailed descriptions thereof will be omitted.

Figure 2:
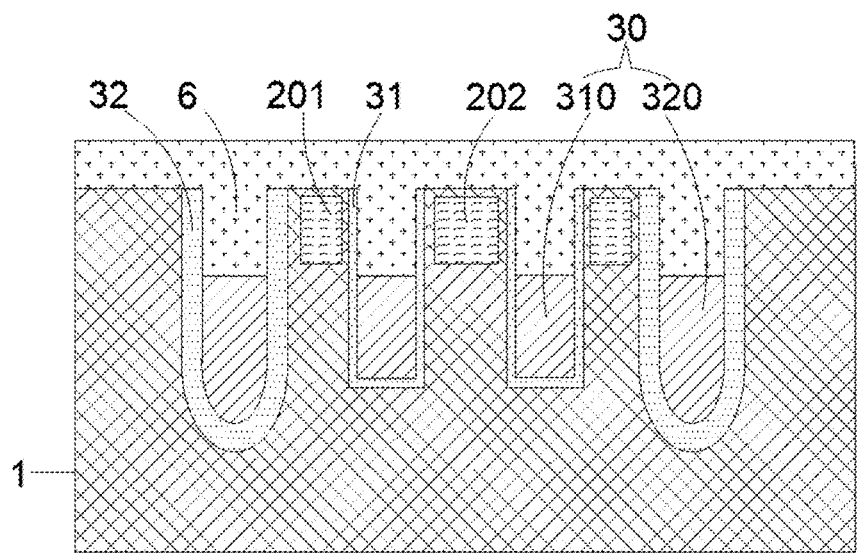
FIG. 2 is a schematic cross-sectional view of FIG. 1 in the direction of A-A.

FIG. 1 is a schematic top view of a structure of a semiconductor device, and FIG. 2 is a schematic cross-sectional view of FIG. 1 in the direction of A-A. Referring to FIGS. 1 and 2, the semiconductor device includes a substrate 1 provided with a shallow trench isolation structure, the shallow trench isolation structure defines multiple active regions 20, the active region 20 is formed with transistors. The shallow trench isolation structure is filled with an insulating material, thereby forming an isolation region 10. The substrate 1 is also provided with a wordline 30 extending in a vertical direction. The wordline 30 penetrates the isolation region 10 and the active region 20, that is, the wordline 30 includes a first wordline structure 310 located in the active region and a second wordline structure 320 located in the isolation region, the first wordline structure 310 located in a part of the active region 20 may be multiplexed as a gate of the transistor, and both sides of the gate is provided with a source 201 and a drain 202 respectively. An outer wall of the wordline multiplexed as the gate is also provided with a wordline isolation layer 31, i.e., a gate insulation layer, to isolate from the source 201 and the drain 202, thereby forming the transistor structure. An outer wall of the wordline located in a part of the isolation region 10 is also provided with a wordline isolation layer 32 to isolate from the substrate 1. A cover layer 6 is also arranged above the wordline 30. It should be noted that in the exemplary embodiment shown in FIGS. 1 and 2, two transistors are arranged in series in one active region, and the sources and drains of the two transistors are shared. Since the cross-sectional view shown in FIG. 2 is a symmetrical structure, only a part thereof is marked, and it may be understood by those skilled in the art that the other part with the same filling line represents the same structure, which is applicable to the following figures, and repetitions will not be described later. In other embodiments, only one transistor may be arranged in one active region. It should also be noted that the cover layer 6 is not shown in FIG. 1 for convenience of illustrating the wordline structure.

A related method for manufacturing a buried wordline structure includes the following operations. A vertical wordline groove is etched on the substrate 1 provided with the isolation region 10 and the active region 20 in advance, and then $H_2$ and $O_2$ are introduced with a certain proportion into the wordline groove by an in-situ steam generation rapid thermal annealing (ISSG) process, temperature is rapidly raised by a bulb, $H_2$ and $O_2$ react on a silicon surface of the wordline groove to form oxygen radicals, and oxygen radicals react with the silicon to form an oxide isolation layer of the wordline. Then titanium nitride, tungsten or the like are deposited in the oxide isolation layer to form the wordline structure. When the wordline structure is formed, the method is required to etch a wordline trench in the isolation region 10 and the active region 20, and then form the wordline isolation layer and the wordline in the wordline trench. The process steps thereof are cumbersome, so that the cost is high and the processing efficiency is difficult to improve. On the other hand, the wordline isolation layer 31 formed by the ISSG process usually has a problem of uneven thickness, which easily causes leakage when it is used as the gate insulation layer of the transistor, thereby affecting the performance of the semiconductor device.

Figure 3:
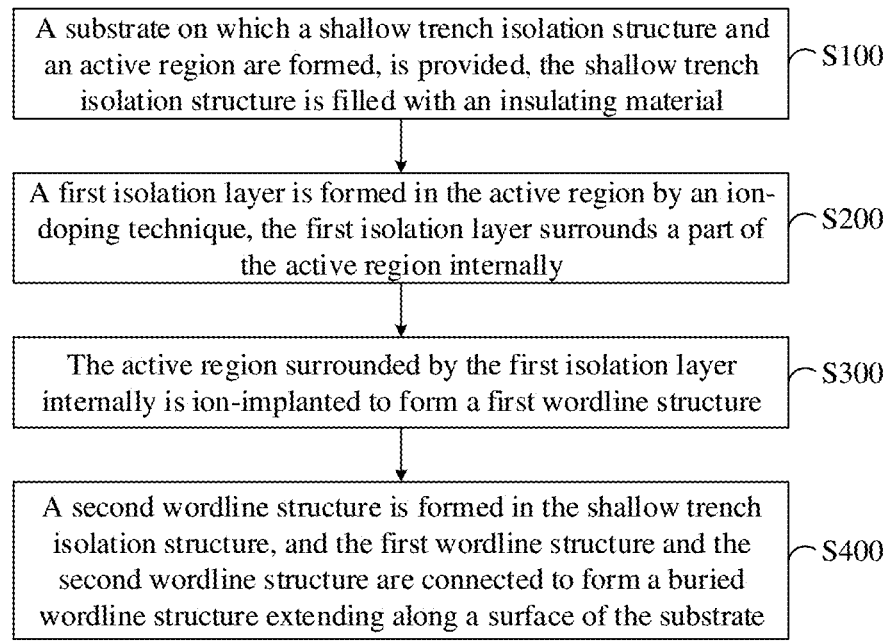
FIG. 3 is a flowchart of a method for manufacturing a semiconductor device according to an embodiment of the disclosure.

In view of this, the disclosure provides a method for manufacturing a semiconductor device, and referring to FIG. 3 which is a flowchart of a method for manufacturing a semiconductor device according to an embodiment of the disclosure, the manufacture method includes the following operations.

In operation S100, a substrate 1 on which a shallow trench isolation structure 101 and an active region 20 are formed, is provided, the shallow trench isolation structure is filled with an insulating material 102 to form an isolation region 10.

In operation S200, a first isolation layer 330 is formed in the active region 20 by an ion-doping technique, the first isolation layer 330 surrounds a part of the active region internally.

In operation S300, the active region surrounded by the first isolation layer 330 internally is ion-implanted to form a first wordline structure 310.

In operation S400, a second wordline structure 320 is formed in the shallow trench isolation structure 101, and the first wordline structure 310 and the second wordline structure 320 are connected to form a buried wordline structure extending along a surface of the substrate 1.

In the manufacture method, when the wordline structure is formed in a part of the active region 20, the first isolation layer 330 is directly formed inside the active region 20 of the silicon substrate 1 by the ion-doping technique, and then the active region surrounded by the first isolation layer 330 is ion-implanted to form a first wordline structure 310 having characteristics of a conductor, thereby completing manufacture of the wordline of the active region 20. Then a second wordline structure 320 is formed in the shallow trench isolation structure, thereby completing manufacture of the wordline of the isolation region 10. The method forms the wordline isolation layer without etching a wordline trench in the active region 20, and the wordline isolation layer formed by the ion-doping technique is uniform in thickness. When a part of the wordline is multiplexed as the gate of the transistor, the wordline isolation layer is used as a gate insulation layer, which has a good isolation performance, does not easily leak current, and ensures good performance of the semiconductor device. Meanwhile, the method may manufacture the wordline of the active region by ion implantation using the existing material of the substrate, without depositing the metal material of the wordline, which also simplifies the method for manufacturing the wordline of the active region.

With reference to FIGS. 4 to 16, the manufacture method according to the embodiment of the disclosure will be described below in detail step-by-step.

Figure 4:
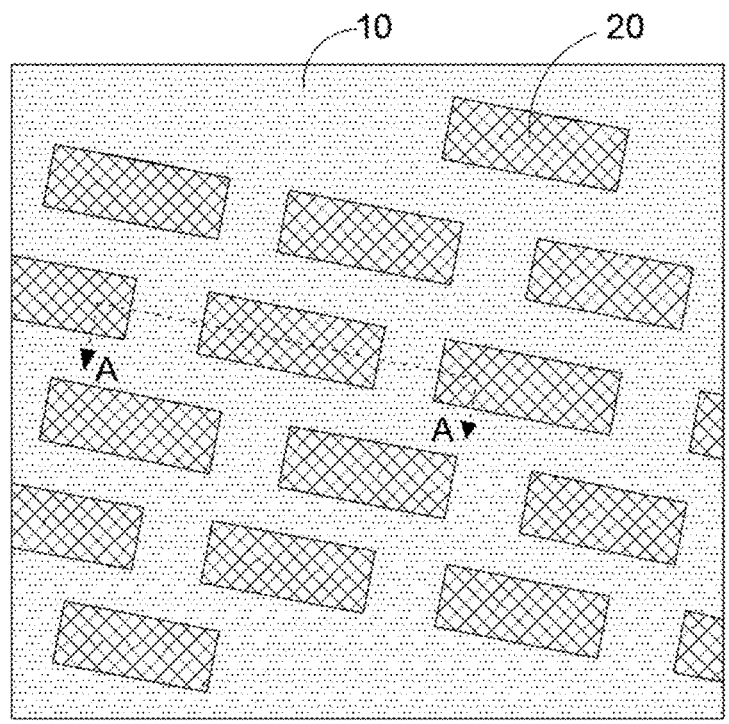
FIG. 4 is a top view of a substrate according to an embodiment of the disclosure.
Figure 5:
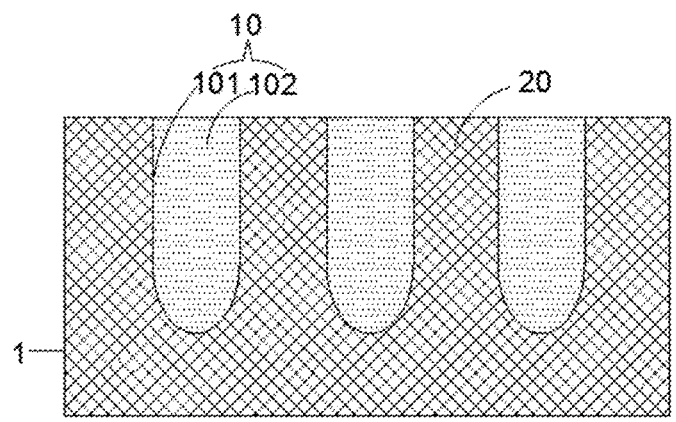
FIG. 5 is a schematic cross-sectional view of a part of the structure of FIG. 4 in the direction of A-A.

In operation S100, a substrate 1 is provided. Referring to FIGS. 4 and 5, FIG. 4 is a schematic top view of a substrate, and FIG. 5 is a schematic cross-sectional view of a part of the substrate in the direction of A-A. As shown, the substrate 1 is formed with a shallow trench isolation structure 101, the shallow trench isolation structure 101 defines multiple active regions 20 in the substrate 1, and the shallow trench isolation structure 101 is filled with an insulating material 102 to form an isolation region 10.

The substrate 1 is a semiconductor substrate, and the material for forming the substrate 1 includes, but is not limited to, a monocrystal silicon substrate, a polysilicon substrate, a gallium nitride substrate or a sapphire substrate. Furthermore, when the semiconductor substrate is the monocrystal silicon substrate or the polysilicon substrate, the semiconductor substrate may be an intrinsic silicon substrate or a slightly doped silicon substrate, and may further be an N-type polysilicon substrate or a P-type polysilicon substrate. In the embodiment of the disclosure, it is preferable for the substrate 1 to use a low-doped monocrystal silicon material (such as NTD-Si). The material of the substrate has good and uniform resistivity, achieves high accuracy in subsequent doping and introduces less impurities, so that impurity striation in conventional doping may be avoided.

The shallow trench isolation structure 101 is formed on the semiconductor substrate 1 by a Shallow Trench Isolation (STI) technique. Specifically, a silicon nitride layer may be deposited on the substrate 1 and then patterned to form a hard mask. Then the substrate 1 is etched to form a steep shallow trench isolation structure 101. Finally, the shallow trench isolation structure 101 is filled with the insulating material 102 to form the isolation region 10. The filled insulating material 102 may be silicon nitride, silicon oxide, or the like.

The shape of the active region 20 is defined by the shape of the isolation region 10, and the parallelogram-shaped active region 20 shown in FIG. 4 is only a schematic. The shape of the active region 20 may also be rectangular, elliptical or other shapes. In an actual product structure, irregular edges may also be formed due to the influence of accuracy of the process for etching the shallow trench isolation structure 101. The disclosure does not specifically define the shapes of the isolation region 10 and the active region 20.

In operation S200, a first isolation layer 330 is formed in the active region 20 by an ion-doping technique, the first isolation layer 330 surrounds a part of the active region.

In the operation, the forming the first isolation layer 330 by the ion-doping technique includes two process operations as follows. 1) Injection of oxygen-containing ions, in which oxygen-containing ions are injected into the active region by an oxygen injector, to generate a high-concentration oxygen injection layer below the silicon surface. 2) High-temperature annealing, causes the implanted oxygen-containing ions reacting with silicon, to form an insulating silicon dioxide isolation layer. Here the oxygen-containing ions may be $O^+$, $O_2^+$, $HO^+$, $H_2O+$, or the like. In some embodiments, the oxygen-containing ions may further include nitrogen-containing ions, such as $N^+$, $N2^+$, or the like, thereby also forming an insulating buried layer with silicon dioxide and silicon nitride mixed. The isolation layer formed by the method is uniform in thickness, and the isolation layer may be used as a gate isolation layer to achieve a good and stable insulation effect, so that leakage is less easily to occur.

In the exemplary embodiment, in order to form the trench-shaped first isolation layer 330 in the active region 20 as shown in FIG. 2, the operation may be performed by dividing into two sub-operations, a bottom 331 of the first isolation layer is manufactured, and then a sidewall 332 of the first isolation layer is manufactured. Specifically, the operation S200 may include the following sub-operations.

Figure 7:
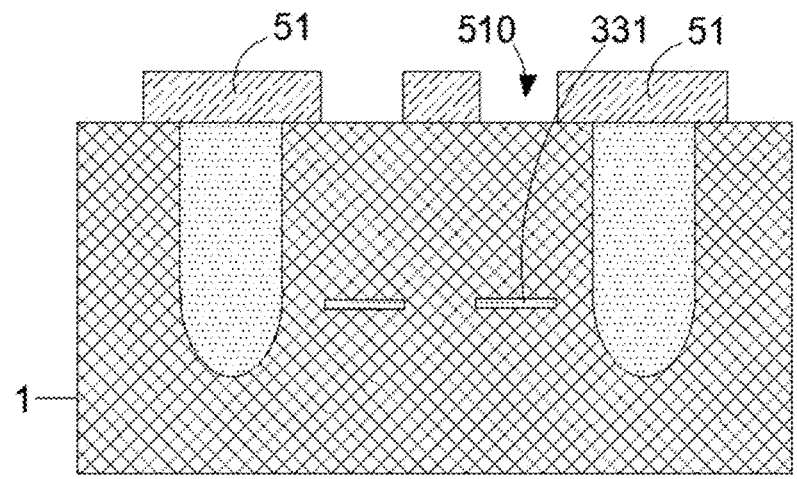
FIG. 7 is a schematic cross-sectional view of the semiconductor device of FIG. 6 in the direction of A-A before removing a first mask layer.

In operation S210, a first mask layer 51 having a first opening 510 is formed on the substrate 1. Referring to FIG. 7, FIG. 7 is a schematic cross-sectional view of a semiconductor device including the first mask layer 51. The first opening 510 of the first mask layer 51 has the same shape with the bottom 331 of the first isolation layer to be formed, and the first opening 510 is located just above the bottom 331 of the first isolation layer to be formed, while the rest of the substrate 1 is covered by the first mask layer 51. That is, the projection of the first opening 510 on the substrate 1 and the projection of the finally formed bottom 331 structure should be able to coincide, and the material of the first mask layer 51 may be photoresist, which may be formed on the substrate 1 by coating, exposure development techniques. The first mask layer 51 may be a hard mask layer such as silicon nitride, boron-phosphorosilicate glass, or the like. The hard mask may be formed by chemical vapor deposition (CVD), physical vapor deposition (PVD) or other deposition processes.

In operation S220, further referring to FIG. 7, oxygen-containing ions are implanted into the active region 20 through the first opening 510, the first mask layer 51 is removed, and a bottom 331 of the first isolation layer 330 is formed by annealing.

In the operation, the implantation energies of the oxygen-containing ions are required to be set according to the insulation performance and the position of the first isolation layer 330 to be formed. The larger the implantation energy is, the deeper the position of the formed silicon dioxide buried layer is, otherwise, the shallower the position of the formed silicon dioxide buried layer is. Of course, the implantation energy is not in a linear relationship with the depth, and a reasonable choice is required to be made according to the structure and performance of the semiconductor device to be formed. In the present embodiment, energies of the oxygen-containing ions implanted in the operation are controlled to always keep at a constant value so that the oxygen-containing ions are implanted to the same depth, thereby forming a horizontal silicon dioxide buried layer, that is, forming the bottom 331 structure of the first isolation layer as shown. Since the energy implanted in the operation is always at a constant value, the setting of ion-implanting parameters may be simplified. It should be noted that the horizontal bottom 331 structure is only an ideal schematic description. In the actual process of implanting ions, ions inevitably diffuse to a certain extent. For example, the ions at the edge tend to diffuse outward, so that the silicon dioxide buried layer is not formed as a fully standard horizontal buried layer.

Figure 6:
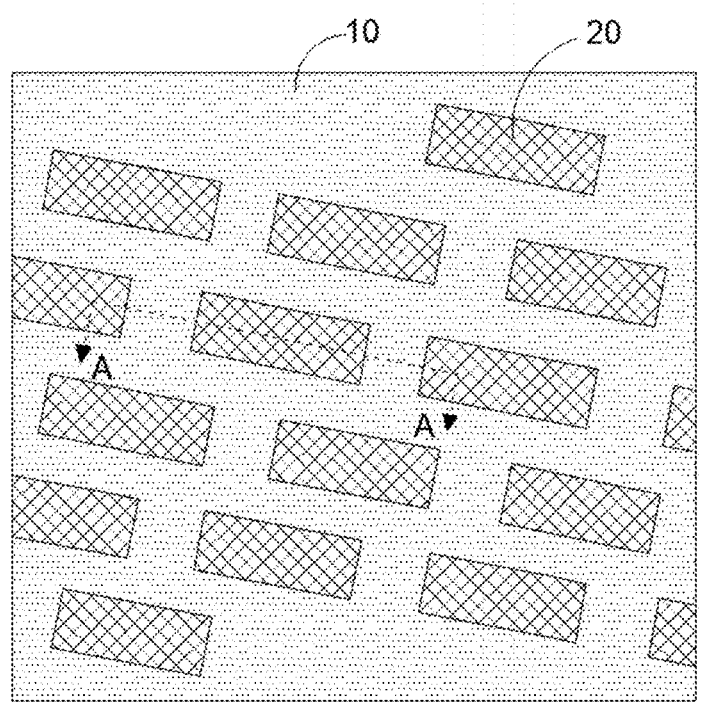
FIG. 6 is a top view of a semiconductor device forming a bottom of a first isolation layer.

In the operation, when the material of the first mask layer 51 is photoresist, the first mask layer 51 may be removed directly. When the first mask layer 51 is a hard mask, the method for removing the first mask layer 51 may be dry etching. FIG. 6 shows a top view of the semiconductor device after forming the bottom of the first isolation layer and removing the first mask layer. It may be understood that FIG. 7 may be considered as a schematic cross-sectional view of a part of the semiconductor device of FIG. 6 in the direction of A-A before removing the first mask layer.

In the operation, parameters such as temperature, time, atmosphere or the like of the annealing may be set according to the actual situation of the device. For example, the annealing temperature may be 800-1500° C., the annealing time may be 1-24 hours, and the annealing atmosphere may be a mixed gas of Ar and $O_2$ or $N_2$ and $O_2$.

Figure 9:
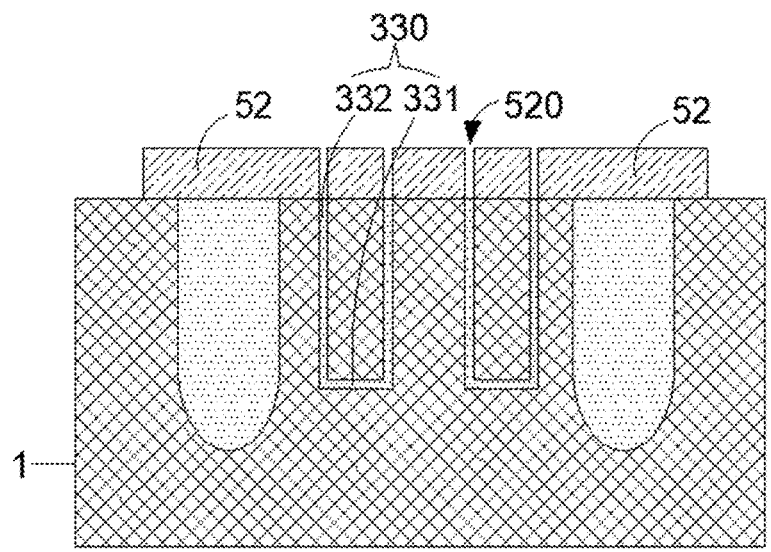
FIG. 9 is a schematic cross-sectional view of the semiconductor device of FIG. 8 in the direction of A-A before removing a second mask layer.

In operation S230, a second mask layer 52 having a second opening 520 is formed on the substrate 1. Referring to FIG. 9, FIG. 9 is a schematic cross-sectional view of a semiconductor device including the second mask layer 52. The second opening 520 of the second mask layer 52 is located just above the sidewall 332 of the first isolation layer 330 to be formed, while the rest of the substrate 1 is covered by the second mask layer 52. That is, the projection of the second opening 520 on the substrate 1 and the projection of the finally formed sidewall 332 of the first isolation layer 330 should be able to coincide. The material and formation process of the second mask layer 52 may refer to those of the first mask layer 51, which may be the same or different.

In the operation, since the sidewall 332 of the first isolation layer 330 is very small in size and requires extremely high accuracy of the second mask layer 52, it may be manufactured by an extreme ultraviolet (EUV) lithography method.

In operation S240, oxygen-containing ions are implanted into the active region 20 through the second opening 520, the second mask layer 52 is removed, and a sidewall 332 of the first isolation layer 330 is formed by annealing, the bottom 331 of the first isolation layer and the sidewall 332 of the first isolation layer constitute the first isolation layer 330.

In order to form a vertical sidewall, the oxygen-containing ions implanted in the operation should be distributed vertically in the substrate 1 and located just above the edge of the bottom 331 structure formed in operation S220, the vertical sidewall 332 is connected to the edge of the bottom 331 buried layer, thereby forming an integral part. As previously shown, the depth of implanting the oxygen-containing ions is determined by the implantation energies of the oxygen-containing ions. In the present embodiment, as a preferred manner, energies of the oxygen-containing ions implanted in the operation are controlled to gradually decrease from large to small during implanting the oxygen-containing ions through the second opening 520, so that the oxygen-containing ions are implanted gradually into the substrate 1 from deep to shallow and distributed in a vertical direction of the substrate 1; meanwhile, in the implantation process, the concentrations of the oxygen-containing ions are controlled to be substantially uniform so that the oxygen-containing ions are distributed uniformly in the vertical positions, the thickness of the vertical silica sidewalls formed after annealing is uniform, and the performance of the sidewalls at various positions is substantially uniform. Further, a maximum energy of the oxygen-containing ions implanted in the operation is equal to energy of the oxygen-containing ions implanted through the first opening 510, so as to ensure that the depth of implanting the oxygen-containing ions for forming the sidewall 332 coincides with the depth of implanting the oxygen-containing ions for forming the bottom 331, and finally, the vertically formed sidewall of the first isolation layer may be connected to the horizontally formed bottom of the first isolation layer to form an integral first isolation layer structure. It should be noted that the vertical sidewall 332 is only an ideal schematic description. In the actual process of implanting ions, ions inevitably diffuse to a certain extent. For example, the ions at the edge tend to diffuse outward, so that the silicon dioxide buried layer is not formed as a fully standard buried layer distributed in the thickness direction.

Figure 8:
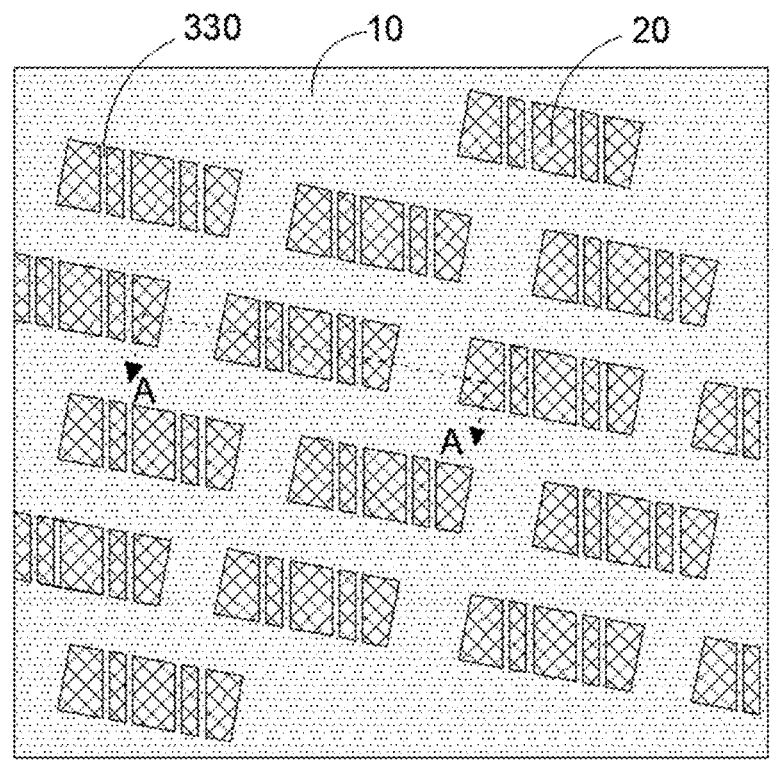
FIG. 8 is a top view of a semiconductor device forming a sidewall of a first isolation layer.

In the operation, the method for removing the second mask layer 52 refers to the method for removing the first mask layer 51, and parameters such as temperature, time, atmosphere or the like of the annealing may be set according to the actual situation of the device. FIG. 8 shows a top view of the semiconductor device after removing the second mask layer, and it may be understood that FIG. 9 may be considered as a schematic cross-sectional view of a part of the semiconductor device of FIG. 8 in the direction of A-A before removing the second mask layer.

After the operations S210-S240, the manufacture of the first isolation layer 330 of the active region 20 is completed, and a top view of the resulting semiconductor device is shown in FIG. 8. The manufacture method does not require etching the active region 20 or depositing the isolation layer, but the manufacture of the isolation layer is completed in one operation by the ion-doping technique, thereby greatly simplifying the manufacture process.

Figure 10:
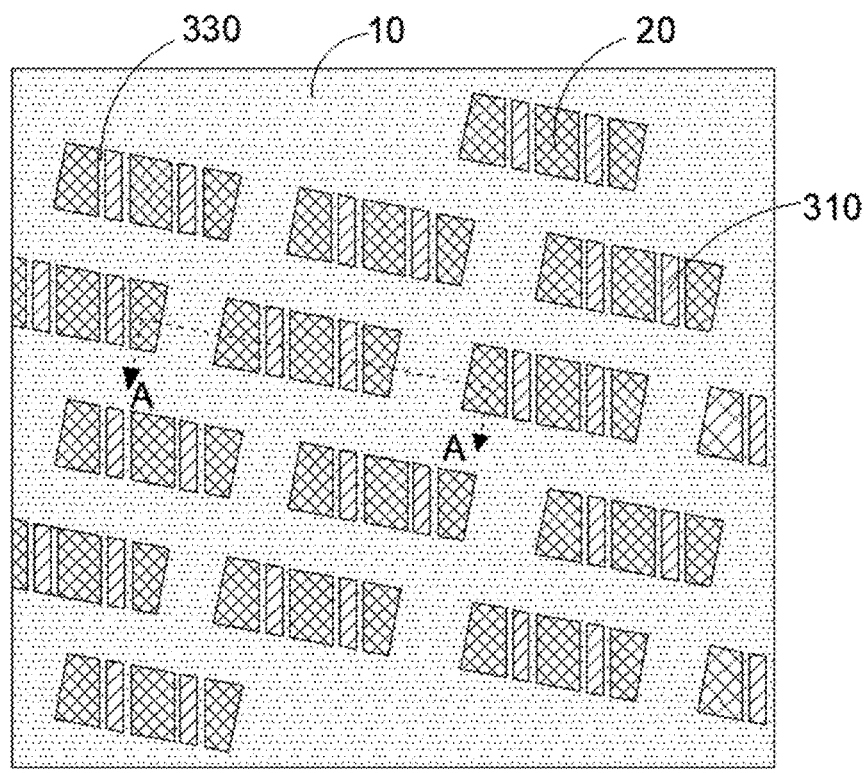
FIG. 10 is a top view of a semiconductor device after forming a first wordline structure.
Figure 11:
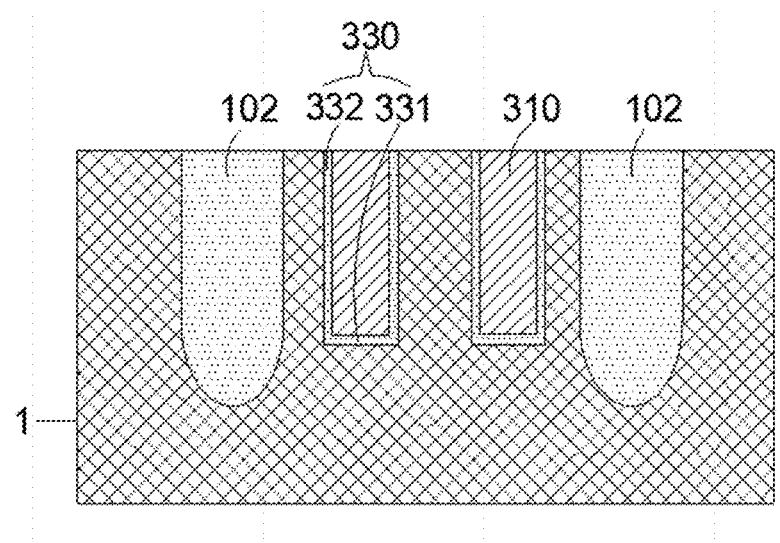
FIG. 11 is a schematic cross-sectional view of part of FIG. 10 in the direction of A-A.

In operation S300, the active region surrounded by the first isolation layer 330 internally is ion-implanted to form a first wordline structure 310 located in the active region 20. The first wordline structure 310 formed in the operation may be refer to FIGS. 10 and 11. FIG. 10 is a top view of the semiconductor device after forming the first wordline structure 310, and FIG. 11 is a schematic cross-sectional view of part of FIG. 10 in the direction of A-A. The types of ions implanted in the operation may be P ions, N ions, B ions, or combinations thereof. The specific types of ions may be selected according to the performance of the semiconductor device to be manufactured.

In the operation, the types of implanted ions are determined by the types of the substrate and the transistor. Since substrate silicon, i.e., low-doped monocrystal silicon (e.g., NTD-Si), is surrounded by the first isolation layer 330 internally, the doping accuracy is high, less impurities are introduced, so that impurity striation in conventional doping may be avoided, the doped material may reach the work function required for the gate, and the resistivity may match the threshold voltage. It should be noted that when ions are implanted, an ion implantation window is required to be formed, that is, it may be formed by exposure development of a photoresist similar to that in operation S200, repetitions will not be described here.

In operation S400, referring to FIGS. 10-17, a second wordline structure is formed in the shallow trench isolation structure.

In the operation, the second wordline structure may be manufactured by the following operations.

Figure 12:
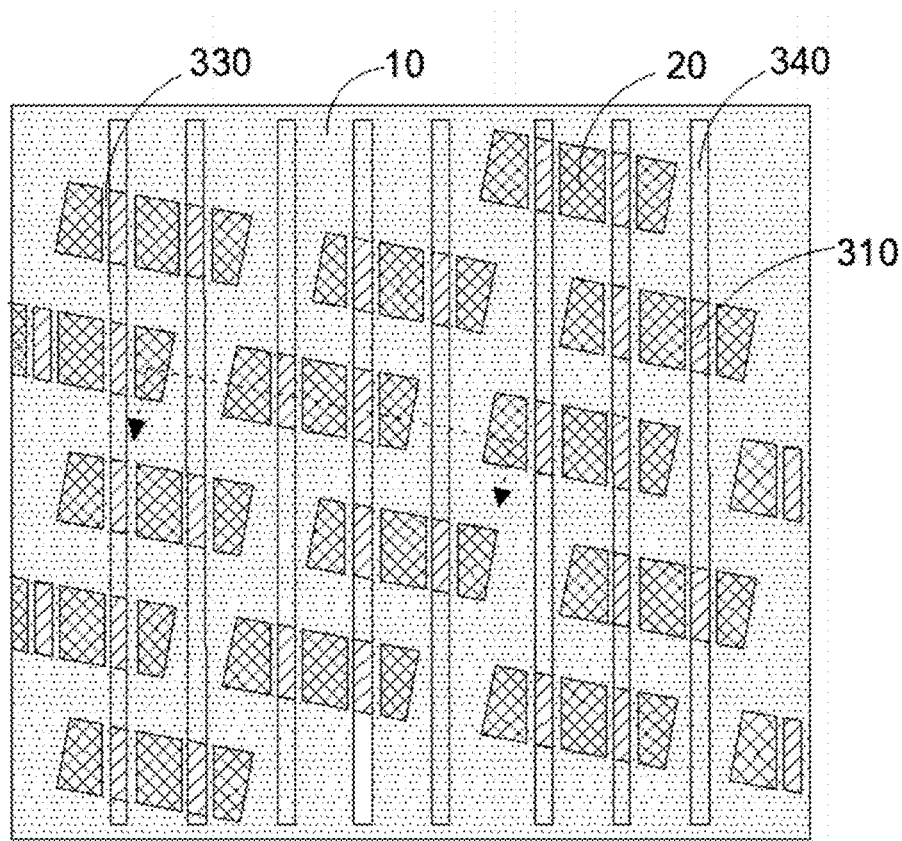
FIG. 12 shows a top view of a semiconductor device after forming a second isolation layer.
Figure 13:
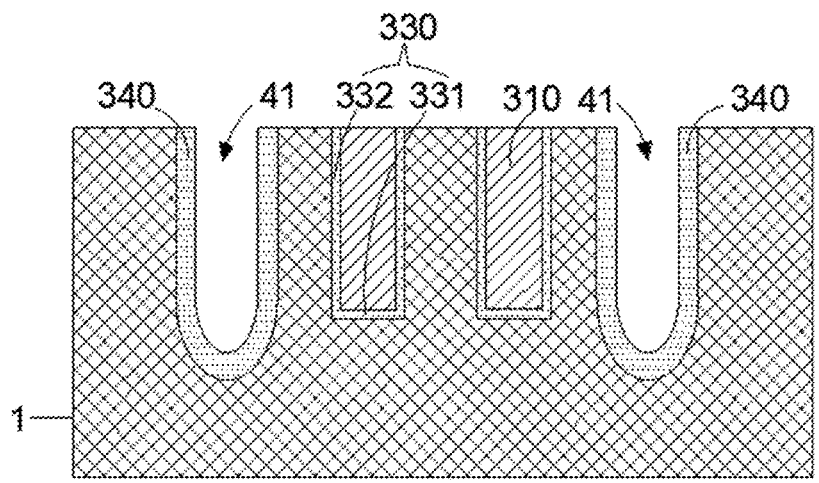
FIG. 13 is a schematic cross-sectional view of part of FIG. 12 in the direction of A-A.

In operation S410, a part of the insulating material in the shallow trench isolation structure is removed to form a first trench structure 41. Specifically, a part of the insulating material 102 in the shallow trench isolation structure may be removed by etching, the etching depth may be controlled, and the insulating material covering the inner wall of the shallow trench isolation structure 101 may be remained, which forms the second isolation layer 340. The etching may be dry etching. The thickness of the second isolation layer 340 may be set as desired. FIG. 12 shows a top view of the semiconductor device after forming the second isolation layer 340, FIG. 13 is a schematic cross-sectional view of part of FIG. 12 in the direction of A-A. In the operation, the second isolation layer is manufactured by the insulating material that has been filled in the shallow trench isolation structure, which is easy to perform.

Figure 14:
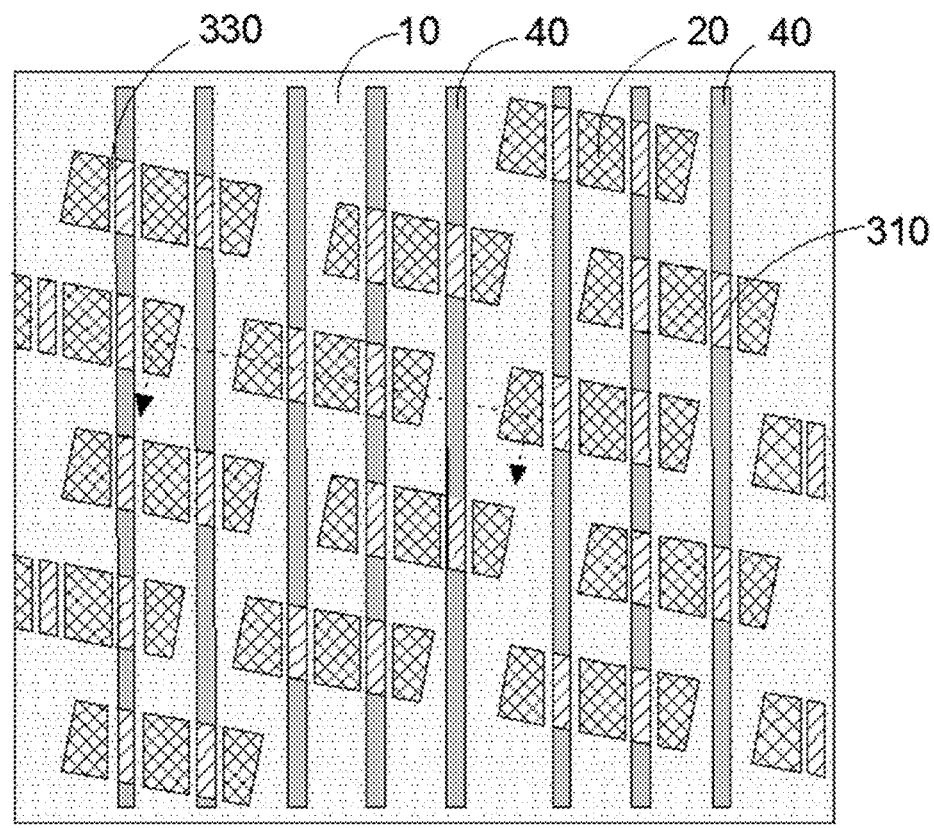
FIG. 14 is a top view of a semiconductor device with a silicon thin film filled in a first trench structure.
Figure 15:
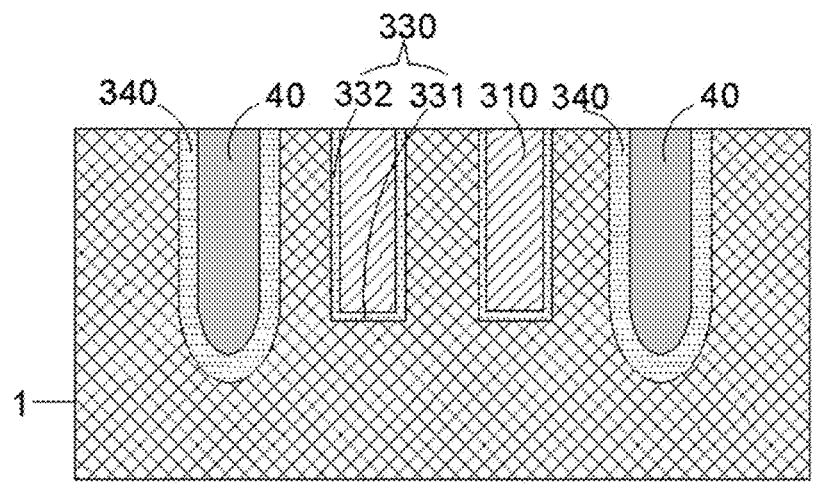
FIG. 15 is a schematic cross-sectional view of part of FIG. 14 in the direction of A-A.
Figure 16:
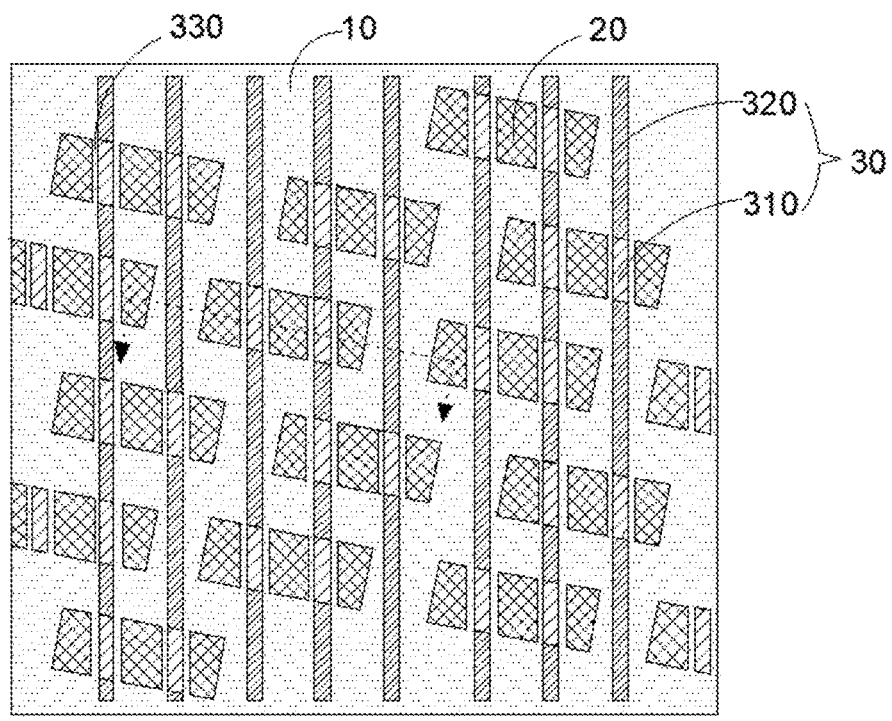
FIG. 16 is a top view of a semiconductor device after forming a second wordline structure.
Figure 17:
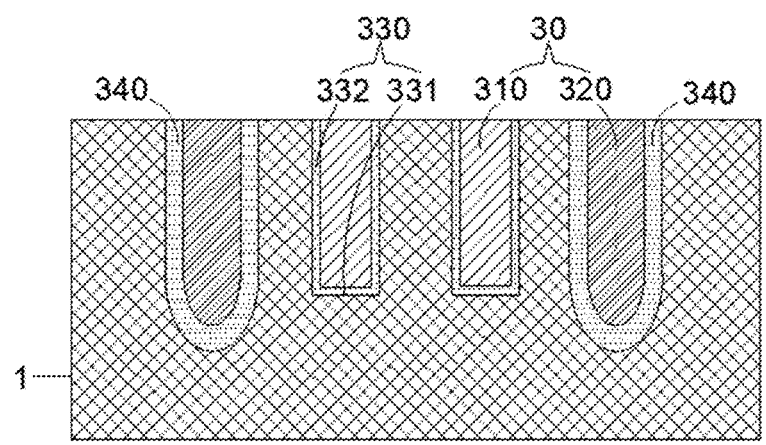
FIG. 17 is a schematic cross-sectional view of part of FIG. 16 in the direction of A-A.

In operation S420, the first trench structure 41 is filled with a silicon thin film 40, and the silicon thin film 40 in the first trench structure 41 is ion-implanted to form the second wordline structure. FIG. 14 shows a top view of the semiconductor device with the silicon thin film 40 filled in the first trench structure 41, FIG. 15 is a schematic cross-sectional view of part of FIG. 14 in the direction of A-A. The filled silicon thin film 40 is located in the second isolation layer 340, and the silicon thin film 40 in the second isolation layer 340 is ion-implanted to form the second wordline structure 320 located in the isolation region 10. The second wordline structure 320 formed in the operation may refer to FIGS. 16 and 17. FIG. 16 is a top view of the semiconductor device after forming the second wordline structure 320, and FIG. 17 is a schematic cross-sectional view of part of FIG. 16 in the direction of A-A.

In the operation, the filled silicon may be a polysilicon thin film grown by CVD or the like. The growth of the polysilicon is simple, and an ideal resistance characteristic may also be obtained after ion implantation. The ion implantation method in the operation may refer to operation S300.

Further, since the first wordline structure and the second wordline structure are connected to form a buried wordline structure extending along a surface of the substrate, when the active region surrounded by the first isolation layer 330 is ion-implanted and the silicon thin film 40 in the first trench structure is ion-implanted, ion-implanting parameters are controlled so that difference value between resistivity of the formed first wordline structure and second wordline structure is within a threshold range, the threshold range may be as small as possible, so that the resistivity of the first wordline structure 310 and the second wordline structure 320 are as close as possible or equal, thereby making performance of the finally formed wordline stable and consistent. Ion-implanting parameters include, but are not limited to, types of ions, concentrations of ions, implantation energies, or the like.

In an embodiment, since the operations S300 and S400 include the operation of implanting silicon, the two operations may also be performed simultaneously to simplify the process. That is, after manufacturing the first isolation layer 330, the second isolation layer 340 is directly formed, and then the monocrystal silicon in the first isolation layer 330 and the polysilicon in the second isolation layer 340 are ion-implanted simultaneously to form the first wordline structure 310 and the second wordline structure 320 simultaneously. It should be noted that process parameters for the two regions are the same at the time of simultaneous implantation, and the silicon material in the active region and the silicon material filled in the first trench structure are not necessarily the same, and it is possible to ensure that the resistivity of the formed first wordline structure 310 and second wordline structure 320 are as close as possible or equal, thereby ensuring that performance of the formed wordline is stable and consistent.

After the above operations, the finally formed first wordline structure 310 and second wordline structure 320 are connected to form a buried wordline structure extending along a surface of the substrate 1, as shown in FIG. 16.

Furthermore, the method for manufacturing a semiconductor device of the present embodiment may further include the following operations.

Figure 18:
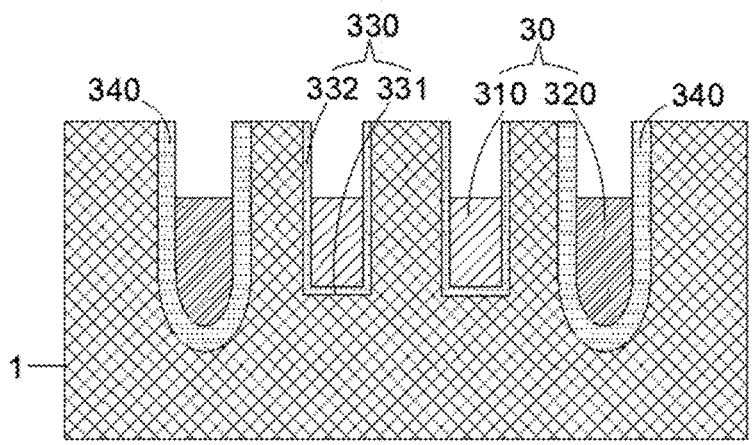
FIG. 18 is a schematic cross-sectional view after forming a second groove.

In operation S600, the first wordline structure 310 and the second wordline structure 320 are etched to obtain a second trench, as shown in FIG. 18.

Furthermore, the method for manufacturing a semiconductor device of the present embodiment may further include the following operations.

Figure 19:
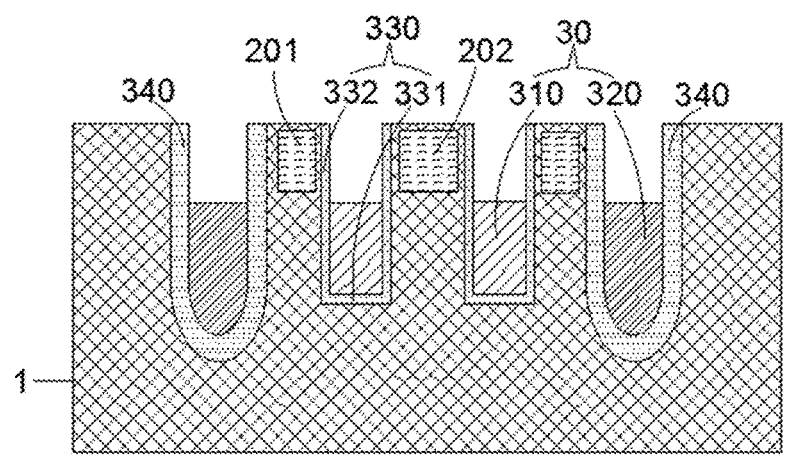
FIG. 19 is a schematic cross-sectional view after forming a source and a drain.

In operation S700, both sides of the second isolation layer 340 are doped to form the source and drain, as shown in FIG. 19.

Furthermore, the method for manufacturing a semiconductor device of the present embodiment may further include the following operations.

Figure 20:
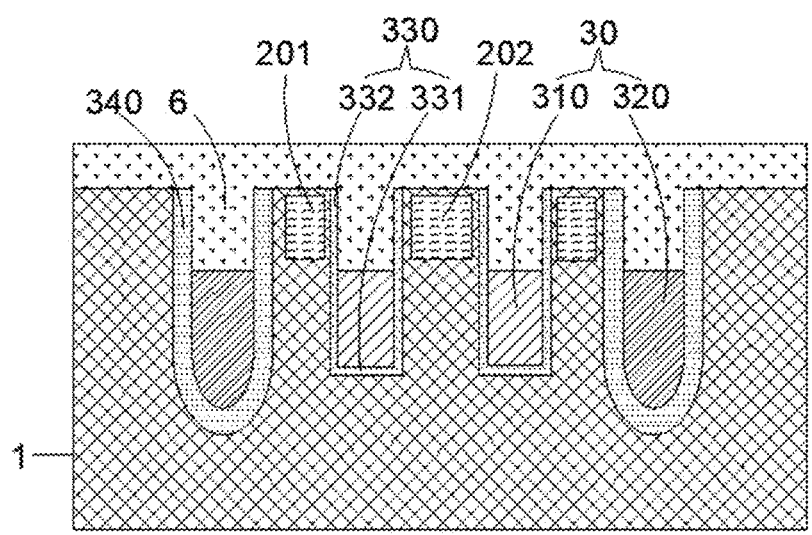
FIG. 20 is a schematic cross-sectional view after forming a cover layer.

In operation S800, a cover layer 6 is formed in the second trench to protect the wordline, as shown in FIG. 20. The cover layer 6 may also cover the active region 20 to protect the active region 20. The material of the cover layer 6 may include one or a combination of silicon nitride, silicon oxide, silicon oxynitride or other insulating materials.

It should be noted that the numbers of the operations do not limit the operations to be implemented, and those skilled in the art may change the order of implementation according to the idea of the disclosure. For example, in an embodiment, the second isolation layer 340 and the second wordline structure 320 may be manufactured, then the first isolation layer 330 and the first wordline structure 310 may be manufactured. For another example, the source and drain may be manufactured, then the second trench is etched and the cover layer 6 is formed.

The manufacture method is described above by example of arranging two transistors in an active region shown in FIGS. 1 and 2. Those skilled in the art will understand that when only one transistor is arranged in the active region, the buried wordline may be manufactured according to the same idea, and the specific process will not be described here.

The isolation layer of the buried wordline of the active region of the semiconductor device manufactured by the manufacture method of the present embodiment is uniform in thickness and is not easily to leak current when it is multiplexed as the gate of the transistor, thereby ensuring good performance of the semiconductor device. The semiconductor device may be used in various storage products such as DRAM or the like, and the disclosure does not limit a specific application field thereof.

While relative terms such as "upper" and "below" are used in the description to describe the relative relationship between one component and another component in the drawings; these terms are used in the description for the convenience purpose only, for example, depending on the direction of the example shown in the drawings. It may be understood that when the device in the drawings is turned over to make it upside-down, the component described as "upper" will become the "below" component. When a structure is "on" other structures, it may mean that the structure is integrally formed on other structures, or the structure is arranged "directly" on other structures, or the structure is arranged "indirectly" on other structures through another structure.

The terms "one", "a", "the", "said" and "at least one" are used to denote that there are one or more elements/components/the like; the terms "include" and "have" are used to denote the meaning of open-ended inclusion and mean that there may also be additional elements/components/the like in addition to the listed elements/components/the like.

Other embodiments of the disclosure may be readily contemplated by those skilled in the art after considering the description and practicing the disclosure disclosed herein. The disclosure is intended to cover any variations, usages or adaptations of the disclosure that follow the general principle of the disclosure and include well-known knowledge or customary technical means in the art that are not disclosed in the disclosure. The description and embodiments are considered to be exemplary only, and the true scope and spirit of the disclosure are indicated by the appended claims.

The invention claimed is:

1. A method for manufacturing a semiconductor device, comprising:
    providing a substrate on which a shallow trench isolation structure and an active region are formed, the shallow trench isolation structure filled with an insulating material;
    forming, by an ion-doping technique, a first isolation layer in the active region, the first isolation layer surrounding a part of the active region;
    ion-implanting the active region surrounded by the first isolation layer to form a first wordline structure; and
    forming a second wordline structure in the shallow trench isolation structure, and connecting the first wordline structure and the second wordline structure to form a buried wordline structure extending along a surface of the substrate.

2. The method for manufacturing a semiconductor device of claim 1, wherein the first wordline structure and the second wordline structure are etched after forming the second wordline structure to form a second trench, and a cover layer is deposited on the second trench.

3. The method for manufacturing a semiconductor device of claim 1, wherein the forming the second wordline structure in the shallow trench isolation structure comprises:
removing a part of the insulating material in the shallow trench isolation structure to form a first trench structure; and
filling the first trench structure with a silicon thin film, and ion-implanting the silicon thin film in the first trench structure to form the second wordline structure.

4. The method for manufacturing a semiconductor device of claim 3, wherein the rest of the insulating material in the shallow trench isolation structure forms a second isolation layer after removing the part of the insulating material in the shallow trench isolation structure.

5. The method for manufacturing a semiconductor device of claim 3, wherein a material of the substrate is a low doped monocrystal silicon material, and the silicon thin film filled in the first trench structure is a polysilicon material.

6. The method for manufacturing a semiconductor device of claim 3, wherein ion-implanting parameters are controlled during ion-implanting the active region surrounded by the first isolation layer and ion-implanting the silicon thin film in the first trench structure, so that difference value between resistivity of the formed first wordline structure and second wordline structure is within a threshold range.

7. The method for manufacturing a semiconductor device of claim 1, wherein the forming, by the ion-doping technique, the first isolation layer in the active region comprises:
injecting, by an oxygen injector, oxygen-containing ions into the active region; and
annealing the substrate to react the oxygen-containing ions with a material of the active region, to generate an insulating oxide so as to form the first isolation layer.

8. The method for manufacturing a semiconductor device of claim 7, wherein the forming, by the ion-doping technique, the first isolation layer in the active region comprises:
forming a first mask layer having a first opening on the substrate;
implanting, through the first opening, oxygen ions into the active region, removing the first mask layer, and forming, by annealing, a bottom of the first isolation layer;
forming a second mask layer having a second opening on the substrate; and
implanting, through the second opening, oxygen ions into the active region, removing the second mask layer, and forming, by annealing, a sidewall of the first isolation layer, the bottom of the first isolation layer and the sidewall of the first isolation layer constituting the first isolation layer.

9. The method for manufacturing a semiconductor device of claim 8, wherein energies of the implanted oxygen-containing ions are controlled to always keep at a constant value during implanting the oxygen-containing ions through the first opening.

10. The method for manufacturing a semiconductor device of claim 9, wherein energies of the implanted oxygen-containing ions are controlled to gradually decrease from large to small during implanting the oxygen-containing ions through the second opening, so that the oxygen-containing ions are distributed in a vertical direction of the substrate.

11. The method for manufacturing a semiconductor device of claim 10, wherein a maximum energy of the oxygen-containing ions implanted through the second opening is equal to energy of the oxygen-containing ions implanted through the first opening.

* * * * *